United States Patent
Ishizawa et al.

(10) Patent No.: US 11,626,533 B2
(45) Date of Patent: Apr. 11, 2023

(54) LIGHT EMITTING DEVICE AND PROJECTOR

(71) Applicants: Seiko Epson Corporation, Tokyo (JP); Sophia School Corporation, Tokyo (JP)

(72) Inventors: Shunsuke Ishizawa, Shinjuku (JP); Katsumi Kishino, Akiruno (JP)

(73) Assignees: SEIKO EPSON CORPORATION; Sophia School Corporation

( * ) Notice: Subject to any disclaimer, the term of this patent is extended or adjusted under 35 U.S.C. 154(b) by 246 days.

(21) Appl. No.: 16/829,073

(22) Filed: Mar. 25, 2020

(65) Prior Publication Data
US 2020/0313039 A1    Oct. 1, 2020

(30) Foreign Application Priority Data
Mar. 26, 2019  (JP) .............................. JP2019-059110

(51) Int. Cl.
*H01L 33/06*  (2010.01)
*H01L 33/08*  (2010.01)
(Continued)

(52) U.S. Cl.
CPC .......... *H01L 33/06* (2013.01); *G03B 21/2033* (2013.01); *H01L 21/0259* (2013.01);
(Continued)

(58) Field of Classification Search
CPC ..................................................... H01L 33/08
(Continued)

(56) References Cited

U.S. PATENT DOCUMENTS

2011/0012168 A1 * 1/2011 Armitage .......... H01L 21/02579
257/E33.001
2011/0169025 A1    7/2011 Kishino et al.
(Continued)

FOREIGN PATENT DOCUMENTS

JP    2007-123398 A    5/2007
JP    2018-142660 A    9/2018
(Continued)

OTHER PUBLICATIONS

V.G. Dubrovskii, "Model of Selective Growth of III-V Nanowires", Technical Physics Letters vol. 41, No. 12, pp. 1136-1138 (2015).
(Continued)

*Primary Examiner* — Hsin Yi Hsieh
(74) *Attorney, Agent, or Firm* — Harness, Dickey & Pierce, P.L.C.

(57) ABSTRACT

There is provided a light emitting device including: a substrate; a laminated structure provided on the substrate and having a plurality of first columnar portions and a plurality of second columnar portions; and a first electrode and a second electrode, in which the first columnar portion includes a first semiconductor layer, a second semiconductor layer having a conductivity type different from the first semiconductor layer, and a light emitting layer provided between the first semiconductor layer and the second semiconductor layer, light generated in the light emitting layer propagates through the plurality of first columnar portions and the plurality of second columnar portions, a height of the second columnar portion is equal to or larger than a sum of a thickness of the first semiconductor layer and a thickness of the light emitting layer, and is lower than a height of the first columnar portion, the first semiconductor layer is provided between the substrate and the light emitting layer, the first electrode is electrically coupled to the first semiconductor layer, the second electrode is electrically coupled to
(Continued)

the second semiconductor layer, and the second columnar portion is not electrically coupled to the second electrode.

7 Claims, 7 Drawing Sheets

(51) Int. Cl.
    *H01L 33/18*         (2010.01)
    *H01L 33/24*         (2010.01)
    *H01L 33/30*         (2010.01)
    *G03B 21/20*         (2006.01)
    *H01L 21/02*         (2006.01)
    *H01L 33/46*         (2010.01)

(52) U.S. Cl.
    CPC .............. *H01L 33/08* (2013.01); *H01L 33/18* (2013.01); *H01L 33/24* (2013.01); *H01L 33/30* (2013.01); *H01L 33/46* (2013.01); *H01L 2933/0016* (2013.01); *H01L 2933/0025* (2013.01)

(58) Field of Classification Search
    USPC .......................................................... 257/88
    See application file for complete search history.

(56) References Cited

U.S. PATENT DOCUMENTS

| | | |
|---|---|---|
| 2011/0204327 A1 | 8/2011 | Hiruma et al. |
| 2013/0328096 A1* | 12/2013 | Donofrio ................ H01L 33/44 438/22 |
| 2016/0190392 A1 | 6/2016 | Kuraoka et al. |
| 2019/0198560 A1* | 6/2019 | Kaseya ................. H01L 33/007 |

FOREIGN PATENT DOCUMENTS

| | | |
|---|---|---|
| JP | 2019-029522 A | 2/2019 |
| WO | 2010-023921 A1 | 3/2010 |
| WO | 2010-044129 A1 | 4/2010 |
| WO | 2016-051908 A1 | 4/2016 |

OTHER PUBLICATIONS

K. Kuruma et al., "Position dependent optical coupling between single quantum dots and photonic crystal nanocavities", Appl. Phys. Lett. 109, pp. 071110-1-171110-5 (2016).

Y. Kurisaki et al., "Theoretical investigation of nitride nanowire-based quantum-shell lasers", Phys. Status Solidi A, 214, No. 8, 1600867, 4 pages (2017).

* cited by examiner

LIGHT EMITTING DEVICE AND PROJECTOR

The present application is based on, and claims priority from JP Application Serial Number 2019-059110, filed Mar. 26, 2019, the disclosure of which is hereby incorporated by reference herein in its entirety.

BACKGROUND

1. Technical Field

The present disclosure relates to a light emitting device and a projector.

2. Related Art

Semiconductor laser is expected as a next generation light source with high brightness. In particular, semiconductor laser having a nanostructure called nanocolumn, nanowire, nanorod, nanopillar, and the like is expected to be realized by a light emitting device capable of obtaining high-power light emission at a narrow radiation angle by the effect of a photonic crystal.

International Publication No. 2010/023921 discloses a semiconductor light emitting element including a nanocolumn configured with an n-type semiconductor layer having an n-type cladding layer, an active layer, and a p-type semiconductor layer including a p-type cladding layer. A p-side electrode made of a Ni/Au multilayer film or the like is provided on the p-type semiconductor layer.

In a light emitting device having a nanocolumn as described above, there is a case where a difference in refractive index between a light emitting layer and a cladding layer cannot be increased due to constraints, such as a difference in lattice constant between the light emitting layer and the cladding layer. When the difference in refractive index between the light emitting layer and the cladding layer is small, there is a case where light generated in the active layer leaks to the p-type semiconductor layer side and is absorbed by the p-side electrode.

SUMMARY

A light emitting device according to an aspect of the present disclosure includes: a substrate; a laminated structure provided on the substrate and having a plurality of first columnar portions and a plurality of second columnar portions; and a first electrode and a second electrode, in which the first columnar portion and the second columnar portion are disposed in a direction orthogonal to a lamination direction of the laminated structure, the first columnar portion includes a first semiconductor layer, a second semiconductor layer having a conductivity type different from the first semiconductor layer, and a light emitting layer provided between the first semiconductor layer and the second semiconductor layer, light generated in the light emitting layer propagates through the plurality of first columnar portions and the plurality of second columnar portions, a height of the second columnar portion is equal to or larger than a sum of a thickness of the first semiconductor layer and a thickness of the light emitting layer, and is lower than a height of the first columnar portion, the first semiconductor layer is provided between the substrate and the light emitting layer, the first electrode is electrically coupled to the first semiconductor layer, the second electrode is electrically coupled to the second semiconductor layer, and the second columnar portion is not electrically coupled to the second electrode.

In the light emitting device, a diameter of the second columnar portion may be smaller than a diameter of the first columnar portion.

The light emitting device may further include a light propagation layer which is provided between the first columnar portion and the second columnar portion, and has a refractive index smaller than that of the first semiconductor layer and the second semiconductor layer.

In the light emitting device, the light propagation layer may be provided between the second columnar portion and the second electrode.

In the light emitting device, a layer structure of the first columnar portion may be the same as a layer structure of the second columnar portion.

A projector according to another aspect of the present disclosure includes the light emitting device according to the aspect.

DESCRIPTION OF EXEMPLARY EMBODIMENTS

Hereinafter, appropriate embodiments of the present disclosure will be described in detail with reference to the drawings. The embodiments described below are not inappropriately limited to the contents of the present disclosure described in the appended claims. In addition, not all of the configurations described below are essential configuration requirements of the present disclosure.

1. First Embodiment

1.1. Light Emitting Device

Figure 1:
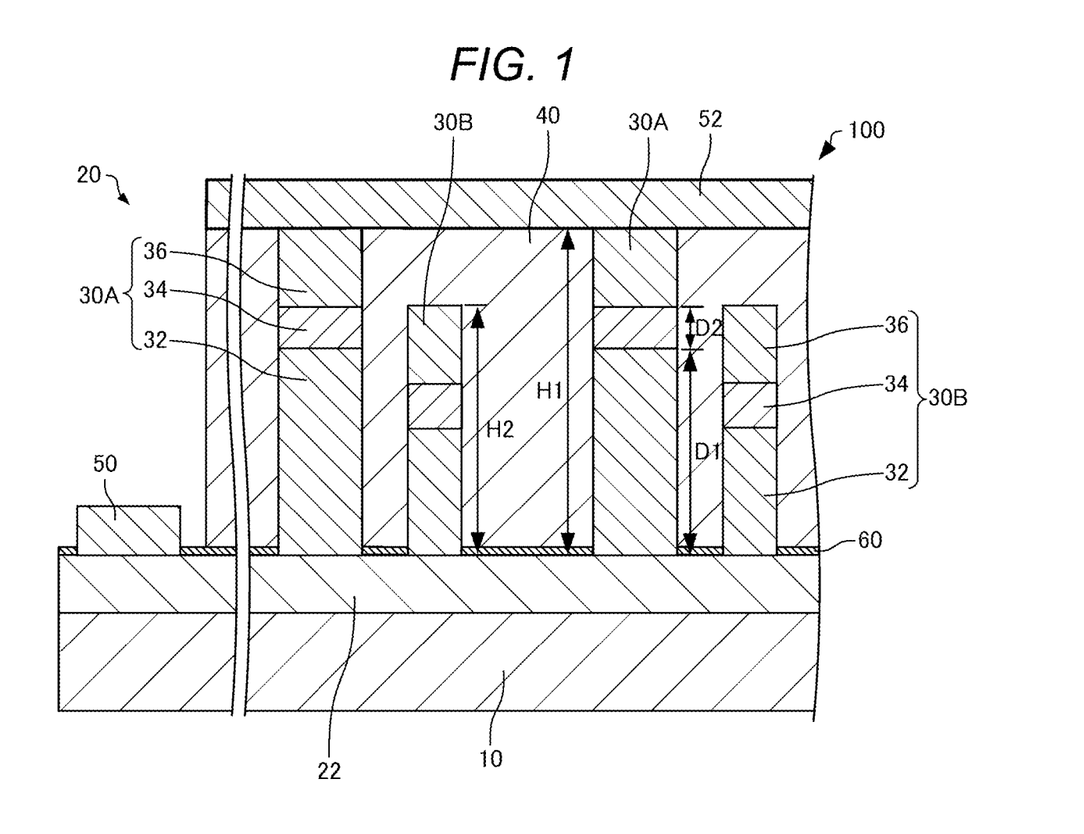
FIG. 1 is a sectional view schematically illustrating a light emitting device according to a first embodiment.
Figure 2:
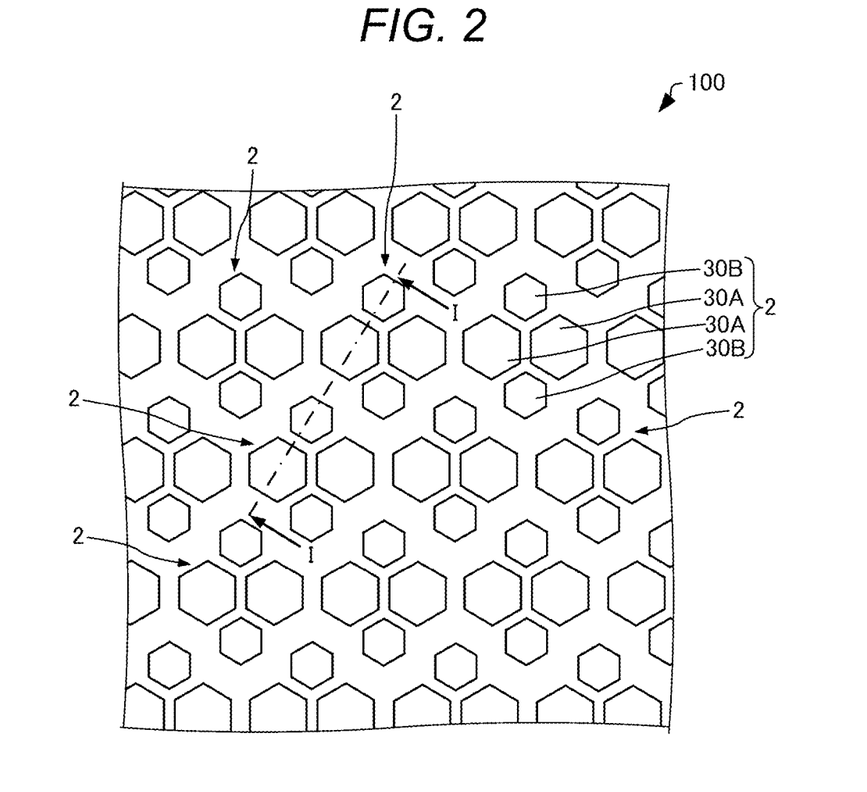
FIG. 2 is a plan view schematically illustrating the light emitting device according to the first embodiment.

First, a light emitting device according to a first embodiment will be described with reference to the drawings. FIG. 1 is a sectional view schematically illustrating a light emitting device 100 according to the first embodiment. FIG. 2 is a plan view schematically illustrating the light emitting device 100 according to the first embodiment. In addition, FIG. 1 is a sectional view taken along the line I-I in FIG. 2.

As illustrated in FIGS. 1 and 2, the light emitting device 100 includes a substrate 10, a laminated structure 20, a first electrode 50, and a second electrode 52. For convenience, in FIG. 2, illustration of members other than a first columnar portion 30A and a second columnar portion 30B of the laminated structure 20 is omitted.

The substrate 10 has, for example, a plate shape. The substrate 10 is, for example, a Si substrate, a GaN substrate, a sapphire substrate, or the like.

The laminated structure 20 is provided on the substrate 10. In the drawings, the laminated structure 20 is provided on the substrate 10. The laminated structure 20 includes, for example, a buffer layer 22, a plurality of first columnar portions 30A, a plurality of second columnar portions 30B, and a light propagation layer 40.

In addition, "upper" means a direction away from the substrate 10 when viewed from a multi quantum well (MQW) layer 34 in a lamination direction (hereinafter, also simply referred to as "lamination direction") of the laminated structure 20, and "lower" means a direction approaching the substrate 10 when viewed from the MQW layer 34 in the lamination direction. Further, the "lamination direction of the laminated structure 20" is a lamination direction of a first semiconductor layer 32 and the MQW layer 34.

The buffer layer 22 is provided on the substrate 10. The buffer layer 22 is, for example, an n-type GaN layer doped with silicon. On the buffer layer 22, a mask layer 60 for forming the first columnar portion 30A and the second columnar portion 30B is provided. The mask layer 60 is, for example, a titanium layer, a titanium oxide layer, a silicon oxide layer, an aluminum oxide layer, or the like.

The first columnar portion 30A and the second columnar portion 30B are provided on the buffer layer 22. The first columnar portion 30A and the second columnar portion 30B are arranged in a direction orthogonal to the lamination direction. The first columnar portion 30A and the second columnar portion 30B have a columnar shape that protrudes upward from the buffer layer 22. The first columnar portion 30A and the second columnar portion 30B are also called, for example, nanocolumns, nanowires, nanorods, and nanopillars.

The cross-sectional shape in the direction orthogonal to the lamination direction of the first columnar portion 30A and the second columnar portion 30B is, for example, a polygon or a circle. In the example illustrated in FIG. 2, the cross-sectional shapes of the first columnar portion 30A and the second columnar portion 30B are regular hexagons.

The first columnar portion 30A includes the first semiconductor layer 32, the MQW layer 34 that functions as a light emitting layer, and a second semiconductor layer 36.

The first semiconductor layer 32 is provided on the buffer layer 22. The first semiconductor layer 32 is provided between the substrate 10 and the MQW layer 34. The first semiconductor layer 32 is an n-type semiconductor layer. The first semiconductor layer 32 is, for example, an n-type GaN layer doped with Si, an n-type AlGaN layer doped with Si, or the like.

The MQW layer 34 is provided on the first semiconductor layer 32. The MQW layer 34 is provided between the first semiconductor layer 32 and the second semiconductor layer 36. In the first columnar portion 30A, the MQW layer 34 functions as a light emitting layer that generates light when a current is injected. The MQW layer 34 has, for example, a multiple quantum well structure in which a quantum well structure configured with an i-type GaN layer not doped with impurities and an i-type InGaN layer is stacked.

The second semiconductor layer 36 is provided on the MQW layer 34. The second semiconductor layer 36 is a layer having a conductivity type different from the first semiconductor layer 32. The second semiconductor layer 36 is an p-type semiconductor layer. The second semiconductor layer 36 is, for example, a p-type GaN layer doped with magnesium, a p-type AlGaN layer doped with magnesium, or the like. The first semiconductor layer 32 and the second semiconductor layer 36 are cladding layers having a function of confining light in the MQW layer 34.

The second columnar portion 30B has the same layer structure as the first columnar portion 30A. In other words, similar to the first columnar portion 30A, the second columnar portion 30B includes the first semiconductor layer 32, the MQW layer 34, and the second semiconductor layer 36.

A height H2 of the second columnar portion 30B is lower than a height H1 of the first columnar portion 30A. In addition, the height H2 of the second columnar portion 30B is equal to or larger than the sum of a thickness D1 of the first semiconductor layer 32 of the first columnar portion 30A and a thickness D2 of the MQW layer 34 of the first columnar portion 30A. In other words, $D1+D2 \leq H2 < H1$ is satisfied. In the example illustrated in the drawing, the height H2 of the second columnar portion 30B is equal to the sum of the thickness D1 of the first semiconductor layer 32 of the first columnar portion 30A and the thickness D2 of the MQW layer 34 of the first columnar portion 30A. In other words, $H2=D1+D2$ is satisfied. The thickness D1 of the first semiconductor layer 32 is the maximum thickness in the lamination direction of the first semiconductor layer 32, and the thickness D2 of the MQW layer 34 is the maximum thickness in the lamination direction of the MQW layer 34.

In addition, the height H1 of the first columnar portion 30A is the maximum size in the lamination direction of the first columnar portion 30A. Further, the height H2 of the second columnar portion 30B is the maximum size in the lamination direction of the second columnar portion 30B.

Since the height H2 of the second columnar portion 30B is smaller than the height H1 of the first columnar portion 30A, the first columnar portion 30A is in contact with the second electrode 52, but the second columnar portion 30B is not in contact with the second electrode 52. The light propagation layer 40 is provided between the second columnar portion 30B and the second electrode 52. A refractive index of the light propagation layer 40 is lower than a refractive index of the first semiconductor layer 32, a refractive index of the MQW layer 34, and a refractive index of the second semiconductor layer 36.

The light generated in the MQW layer 34 of the first columnar portion 30A propagates through the plurality of first columnar portions 30A, the plurality of second columnar portions 30B, and the light propagation layer 40.

Figure 3:
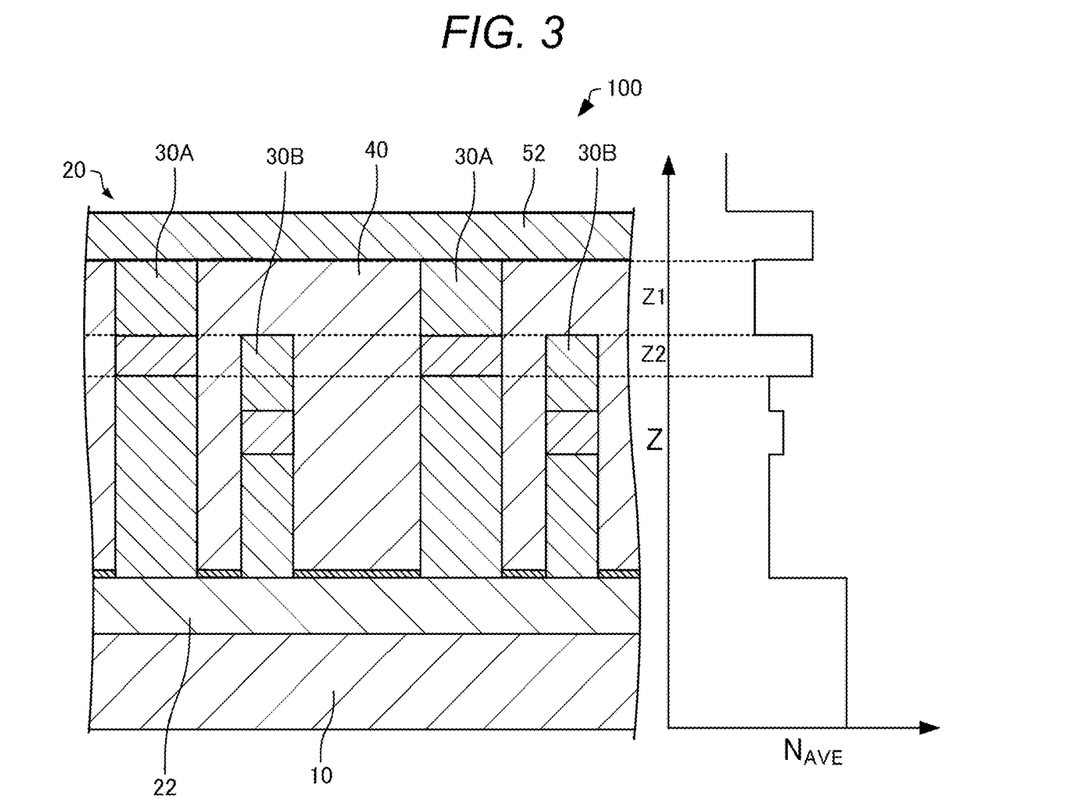
FIG. 3 is a graph illustrating a distribution of average refractive index in a lamination direction of the laminated structure.

FIG. 3 is a graph illustrating a distribution of an average refractive index $N_{AVE}$ in a lamination direction Z of the laminated structure 20. The average refractive index $N_{AVE}$ is an average refractive index in an in-plane direction (hereinafter, also simply referred to as "in-plane direction") of the laminated structure 20 orthogonal to the lamination direction. The average refractive index $N_{AVE}$ is determined by the refractive index of the material and a filling factor of the material in the in-plane direction. The average refractive index $N_{AVE}$ increases as the filling factor of the columnar portions in the in-plane direction increases.

As illustrated in FIG. 3, the laminated structure 20 includes a first part Z1 and a second part Z2. The first part Z1 is a part on the upper side of the MQW layer 34 of the first columnar portion 30A. The first part Z1 includes the second semiconductor layer 36 of the first columnar portion 30A and the light propagation layer 40.

The second part Z2 is a part at which the MQW layer 34 of the first columnar portion 30A is provided in the in-plane direction. The second part Z2 includes the MQW layer 34 of the first columnar portion 30A, the first semiconductor layer 32 of the second columnar portion 30B, and the light propagation layer 40.

As described above, the height H2 of the second columnar portion 30B satisfies the relationship D1+D2≤H2<H1. Therefore, for example, compared to a case where H1=H2, the filling factor of the columnar portion of the first part Z1 becomes small, and the average refractive index $N_{AVE}$ of the first part Z1 becomes low. Further, the filling factor of the columnar portion of the second part Z2 is the same as that in a case where H1=H2 is satisfied. Therefore, the average refractive index $N_{AVE}$ of the second part Z2 is substantially the same as that in a case where H1=H2 is satisfied.

Therefore, in the light emitting device 100, compared to a case where H1=H2, a difference between the average refractive index $N_{AVE}$ of the second part Z2 and the average refractive index $N_{AVE}$ of the first part Z1 can be increased. Accordingly, the amount of light that leaks from the MQW layer 34 of the first columnar portion 30A to the upper side of the MQW layer 34 can be reduced, and the amount of light absorbed by the second electrode 52 can be reduced. In addition, the intensity of light propagating at the second part Z2, that is, in the vicinity of the MQW layer 34 of the first columnar portion 30A can be increased.

Since the height H2 of the second columnar portion 30B is lower than the height H1 of the first columnar portion 30A, the second columnar portion 30B is not in electric contact with the second electrode 52, and a current is not injected to the second columnar portion 30B. In addition, the insulating light propagation layer 40 is provided between the second columnar portion 30B and the second electrode 52. Therefore, the second columnar portion 30B and the second electrode 52 can be more reliably insulated.

The composition of indium in the MQW layer 34 of the second columnar portion 30B is lower than the composition of indium in the MQW layer 34 of the first columnar portion 30A. Therefore, the wavelength of light generated in the MQW layer 34 of the first columnar portion 30A and the wavelength of light absorbed by the MQW layer 34 of the second columnar portion 30B can be shifted. Therefore, the amount of light absorbed by the second columnar portion 30B can be reduced.

The diameter of the second columnar portion 30B is smaller than the diameter of the first columnar portion 30A, for example. As will be described later, the height H2 of the second columnar portion 30B can be set to be lower than the height H1 of the first columnar portion 30A by growing the crystal such that the diameter of the second columnar portion 30B is smaller than the diameter of the first columnar portion 30A. Furthermore, the composition of indium in the MQW layer 34 of the second columnar portion 30B can be lower than the composition of indium in the MQW layer 34 of the first columnar portion 30A.

The "diameter" is a diameter when the planar shape of the first columnar portion 30A is a circle, and a diameter of the smallest inclusive circle when a planar shape of the first columnar portion 30A is not a circle. For example, the diameter of the first columnar portion 30A is the minimum diameter of a circle including a polygon therein when the planar shape of the first columnar portion 30A is a polygon, and is the minimum diameter of the circle including an ellipse therein when the planar shape of the first columnar portion 30A is an ellipse. The same applies to the diameter of the second columnar portion 30B.

The light propagation layer 40 is provided between the first columnar portions 30A and the second columnar portions 30B which are adjacent to each other, between the first columnar portions 30A adjacent to each other, and between the second columnar portions 30B adjacent to each other. Furthermore, the light propagation layer 40 is provided between the second columnar portion 30B and the second electrode 52. The light propagation layer 40 covers the side surface of the first columnar portion 30A and the side surface of the second columnar portion 30B. The refractive index of the light propagation layer 40 is lower than the refractive index of the first columnar portion 30A and the refractive index of the second columnar portion 30B. In other words, the refractive index of the light propagation layer 40 is lower than a refractive indices of the first semiconductor layer 32, the MQW layer 34, and the second semiconductor layer 36. The light propagation layer 40 is, for example, a silicon oxide layer. The light generated in the MQW layer 34 of the first columnar portion 30A can propagate through the light propagation layer 40 in the in-plane direction through the plurality of first columnar portions 30A and the plurality of second columnar portions 30B. In addition, the light propagation layer 40 is not limited to a silicon oxide layer, and for example, may be other insulating layers, such as a GaN or an AlGaN layer.

The first electrode 50 is provided on the buffer layer 22. The buffer layer 22 may be in ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one electrode for injecting a current into the MQW layer 34. As the first electrode 50, a member configured by laminating a Ti layer, an Al layer, and an Au layer in order from the buffer layer 22 side is used, for example. In a case where the substrate 10 is conductive, the first electrode 50 may be provided under the substrate 10 although not illustrated.

The second electrode 52 is provided on the side opposite to base 10 side of the laminated structure 20. In the illustrated example, the second electrode 52 is provided on the second semiconductor layer 36 of the first columnar portion 30A and on the light propagation layer 40. The second semiconductor layer 36 of the first columnar portion 30A may be in ohmic contact with the second electrode 52. The second electrode 52 is electrically coupled to the second semiconductor layer 36 of the first columnar portion 30A. In addition, the second electrode 52 is not electrically coupled to the second semiconductor layer 36 of the second columnar portion 30B. The second electrode 52 is the other electrode for injecting a current into the MQW layer 34. As the second electrode 52, for example, indium tin oxide (ITO) is used.

As illustrated in FIG. 2, the laminated structure 20 includes a plurality of columnar portion groups 2. The columnar portion groups 2 are periodically arranged. For example, the columnar portion groups 2 are arranged at a pitch of approximately 250 nm. In the illustrated example, the plurality of columnar portion groups 2 are arranged in a triangular lattice shape in a plan view from the lamination direction. The arrangement of the plurality of columnar portion groups 2 is not limited to a triangular lattice shape, and may be arranged in a square lattice shape, for example. The plurality of columnar portion groups 2 can exhibit the effect of a photonic crystal. For example, the plurality of columnar portion groups 2 can exhibit an optical confinement effect due to the photonic band edge in visible light.

The columnar portion group 2 includes a plurality of first columnar portions 30A and a plurality of second columnar portions 30B. In the example illustrated in FIG. 2, the columnar portion group 2 includes two first columnar portions 30A and two second columnar portions 30B. A direction in which the two first columnar portions 30A are arranged and a direction in which the two second columnar portions 30B are arranged are, for example, orthogonal to each other. The arrangement of the plurality of first columnar portions 30A and the plurality of second columnar portions 30B is not particularly limited, and the plurality of first columnar portions 30A and the plurality of second columnar portions 30B may be arranged in a triangular lattice shape, a square lattice shape, a honeycomb lattice shape, and the like.

In the light emitting device 100, the columnar portion groups 2 configured with the plurality of first columnar portions 30A and the plurality of second columnar portions 30B are regarded as one nanostructure and are periodically arranged. Accordingly, for example, the diameters of the first columnar portion 30A and the second columnar portion 30B can be reduced compared to a case where one nanostructure is configured with one columnar portion. As a result, strain inherent in the MQW layer 34 can be reduced, and light can be amplified with high efficiency.

The light generated in the MQW layer 34 of the first columnar portion 30A propagates through the light propagation layer 40 in the direction orthogonal to the lamination direction by the first semiconductor layer 32 and the second semiconductor layer 36, a standing wave is formed by the effect of the photonic crystal by the plurality of columnar portion groups 2, and laser oscillation occurs by receiving a gain in the MQW layer 34 of the first columnar portion 30A. Then, the light emitting device 100 emits+first order diffracted light and -first order diffracted light as laser light in the lamination direction.

Figure 4:
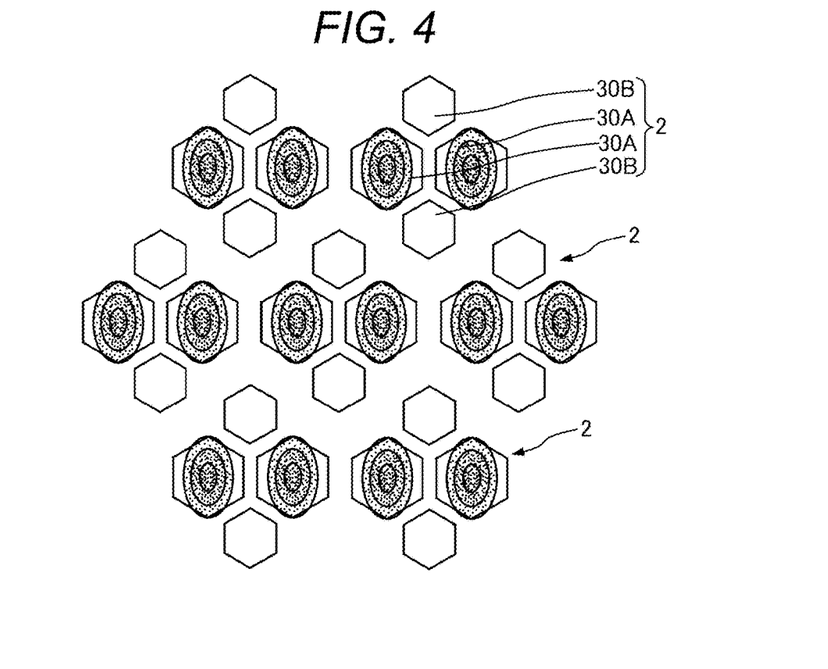
FIG. 4 is a view schematically illustrating an example of an electric field intensity distribution in an optical confinement mode.
Figure 5:
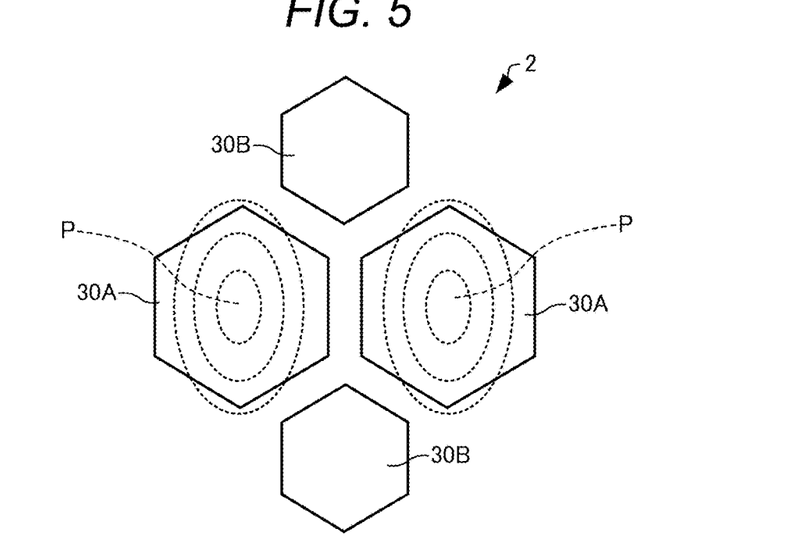
FIG. 5 is a view schematically illustrating an example of the electric field intensity distribution in the optical confinement mode.

FIGS. 4 and 5 are views schematically illustrating an example of an electric field intensity distribution in an optical confinement mode formed by the columnar portion group 2. FIG. 4 illustrates the isointensity lines that couple the positions where the electric field intensities are equal by solid lines. FIG. 5 illustrates the isointensity lines indicated by broken lines. FIG. 5 illustrates one enlarged columnar portion group 2.

In the light emitting device 100, as illustrated in FIG. 4, the optical confinement mode is formed in the plurality of columnar portion groups 2. In other words, in the light emitting device 100, the electric field intensity distribution is formed in the plurality of columnar portion groups 2. In the plurality of columnar portion groups 2, a plurality of modes having different wavelengths and electric field distributions are formed simultaneously. For example, in a photonic crystal in which the plurality of columnar portion groups 2 are two-dimensionally arranged in a triangular lattice shape, when lasing at a photonic band edge is used, a plurality of modes having different wavelengths and electric field distributions are formed simultaneously. As a typical mode among the plurality of modes formed in this manner, FIGS. 4 and 5 illustrate a mode having two peaks P of electric field intensity with respect to one columnar portion group 2. The optical confinement mode can be controlled by, for example, the arrangement of the plurality of columnar portion groups 2. The optical confinement mode can be obtained by using, for example, a plane wave expansion method (PWE method). The optical confinement mode is expressed as a standing wave formed by the effect of the photonic crystal described above. The position of the peak P of electric field intensity is a position where the electric field intensity changes most largely in the standing wave, and is a position where the electric field intensity takes an extreme value.

Here, the MQW layer 34 of the first columnar portion 30A functions as a light emitting layer that generates light when a current is injected, no current is injected into the MQW layer 34 of the second columnar portion 30B, and the MQW layer 34 of the second columnar portion 30B does not function as a light emitting layer. In other words, in the light emitting device 100, the first columnar portion 30A is an active columnar portion to which a current is injected to generate light, and the second columnar portion 30B is an inactive columnar portion to which no current is injected not to cause light emission or absorption.

The first columnar portion 30A is disposed at a position that overlaps the peak P of electric field intensity. The second columnar portion 30B is disposed at a position that does not overlap the peak P. In other words, the electric field intensity in the first columnar portion 30A is larger than the electric field intensity in the second columnar portion 30B. Therefore, in the in-plane direction, the position of the MQW layer 34 of the first columnar portion 30A that functions as the light emitting layer and the position of the peak P of electric field intensity can match each other. Therefore, in the light emitting device 100, a gain can be selectively generated at the position of the peak P of electric field intensity, and the light can be amplified with high efficiency. Accordingly, the lasing threshold value can be reduced.

In one columnar portion group 2, the number of first columnar portions 30A and the number of peaks P are equal to each other. In the example illustrated in FIGS. 4 and 5, in one columnar portion group 2, the number of first columnar portions 30A is two and the number of peaks P is two.

In the light emitting device 100, in the first columnar portion 30A, the p-type second semiconductor layer 36, the MQW layer 34, and the n-type first semiconductor layer 32 configure a pin diode. In the light emitting device 100, when a forward bias voltage of the pin diode is applied between the first electrode 50 and the second electrode 52, a current is injected into the MQW layer 34 of the first columnar portion 30A, and recombination of an electron and a positive hole occurs on the MQW layer 34. The recombination causes light emission. Since the second columnar portion 30B is not electrically coupled to the second electrode 52, no current is injected into the MQW layer 34 of the second columnar portion 30B even when a voltage is applied between the first electrode 50 and the second electrode 52, and the light emission does not occur.

Although not illustrated, a reflective layer may be provided between the substrate 10 and the buffer layer 22 or below the substrate 10. The reflective layer is, for example, a distributed bragg reflector (DBR) layer. The light generated in the MQW layer 34 can be reflected by the reflective layer, and the light emitting device 100 can emit light only from the second electrode 52 side.

For example, the light emitting device 100 has the following characteristics.

In the light emitting device 100, the height H2 of the second columnar portion 30B is equal to or larger than the sum of the thickness D1 of the first semiconductor layer 32 of the first columnar portion 30A and the thickness D2 of the MQW layer 34 of the first columnar portion 30A, and is lower than the height H1 of the first columnar portion 30A. In other words, $D1+D2 \leq H2 < H1$ is satisfied. Therefore, as described above, the amount of light that leaks from the MQW layer 34 of the first columnar portion 30A to the upper side of the MQW layer 34 can be reduced, and the amount of light absorbed by the second electrode 52 can be reduced. Therefore, in the light emitting device 100, the optical confinement factor in the first columnar portion 30A can be increased, and the lasing threshold value can be reduced.

For example, in a general light emitting device, by increasing the difference between the refractive index of the material that configures the second semiconductor layer and the refractive index of the material that configures the MQW layer, the light that leaks to the upper side of the MQW layer can be reduced. However, since the difference between the refractive index of the second semiconductor layer and the refractive index of the MQW layer cannot be increased due to constraints, such as the lattice constant, the second semiconductor layer is thickened, and leakage of light to the upper side of the MQW layer can be reduced.

On the other hand, in the light emitting device 100, as described above, the amount of light that leaks to the upper side of the MQW layer 34 is reduced by providing the second columnar portion 30B. Therefore, in the light emitting device 100, the thickness of the second semiconductor layer 36 can be reduced.

In the light emitting device 100, further, the second columnar portion 30B is not electrically coupled to the second electrode 52. Therefore, no current is injected into the MQW layer 34 of the second columnar portion 30B even when a voltage is applied between the first electrode 50 and the second electrode 52, and the light emission does not occur in the MQW layer 34.

In the light emitting device 100, the diameter of the second columnar portion 30B is smaller than the diameter of the first columnar portion 30A. Here, in the step of crystal growth of the MQW layer 34, the indium composition of the MQW layer 34 decreases as the diameter of the columnar portion decreases. Therefore, in the light emitting device 100, the composition of indium in the second columnar portion 30B is lower than the composition of indium in the first columnar portion 30A. Therefore, the wavelength of light generated in the MQW layer 34 of the first columnar portion 30A and the wavelength of light absorbed by the MQW layer 34 of the second columnar portion 30B can be shifted. Accordingly, in the light emitting device 100, the amount of light absorbed by the second columnar portion 30B can be reduced.

In the light emitting device 100, the light propagation layer 40 which is provided between the first columnar portion 30A and the second columnar portion 30B, and has a refractive index smaller than that of the first semiconductor layer 32 and the second semiconductor layer 36, is further provided. Therefore, the light generated in the MQW layer 34 of the first columnar portion 30A can be efficiently propagated. In addition, the light propagation layer 40 is provided between the second columnar portion 30B and the second electrode 52. Therefore, the second columnar portion 30B and the second electrode 52 can be more reliably insulated.

In the light emitting device 100, a layer structure of the first columnar portion 30A is the same as a layer structure of the second columnar portion 30B. Therefore, as will be described later, the first columnar portion 30A and the second columnar portion 30B can be formed simultaneously.

In the description above, a case where the light emitting device 100 is a surface emitting laser using the effect of a photonic crystal has been described, but the light emitting device according to the above-described embodiment can be applied to a light emitting device, such as an LED or a resonant light emitting diode.

1.2. Manufacturing Method of Light Emitting Device

Figure 6:
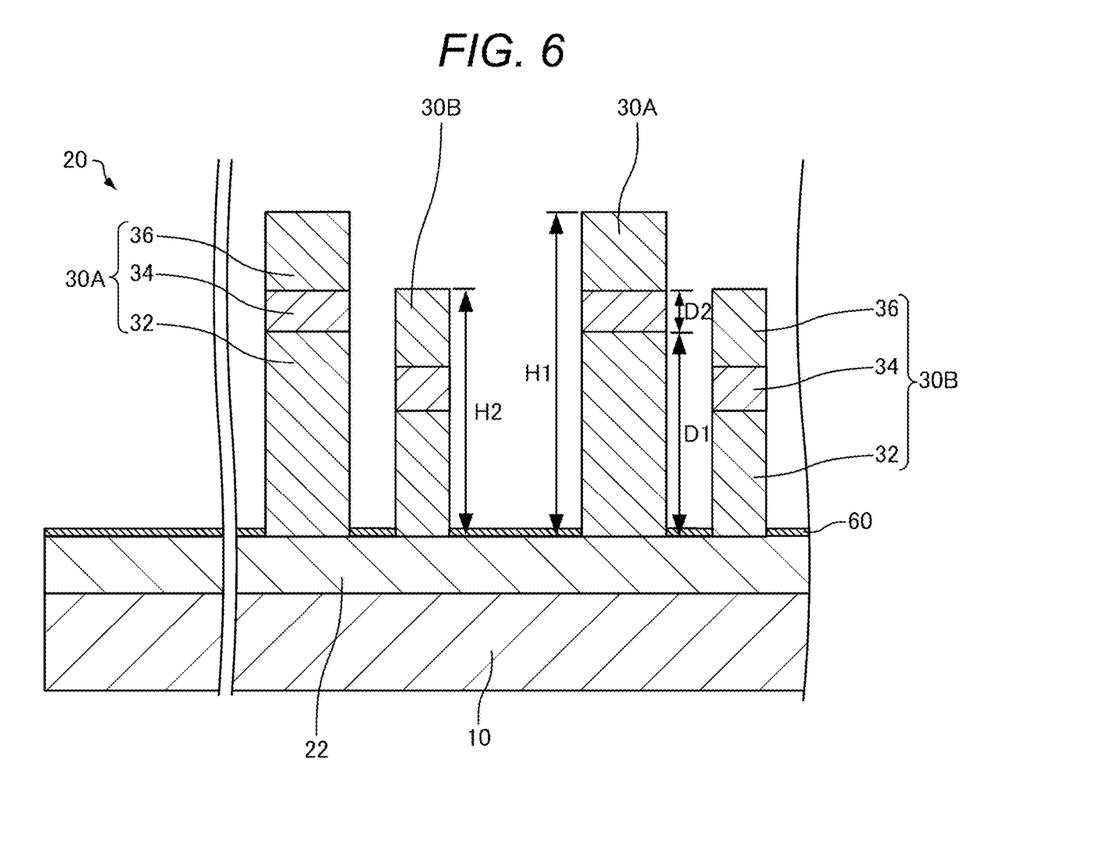
FIG. 6 is a sectional view schematically illustrating a manufacturing process of the light emitting device according to the first embodiment.
Figure 7:
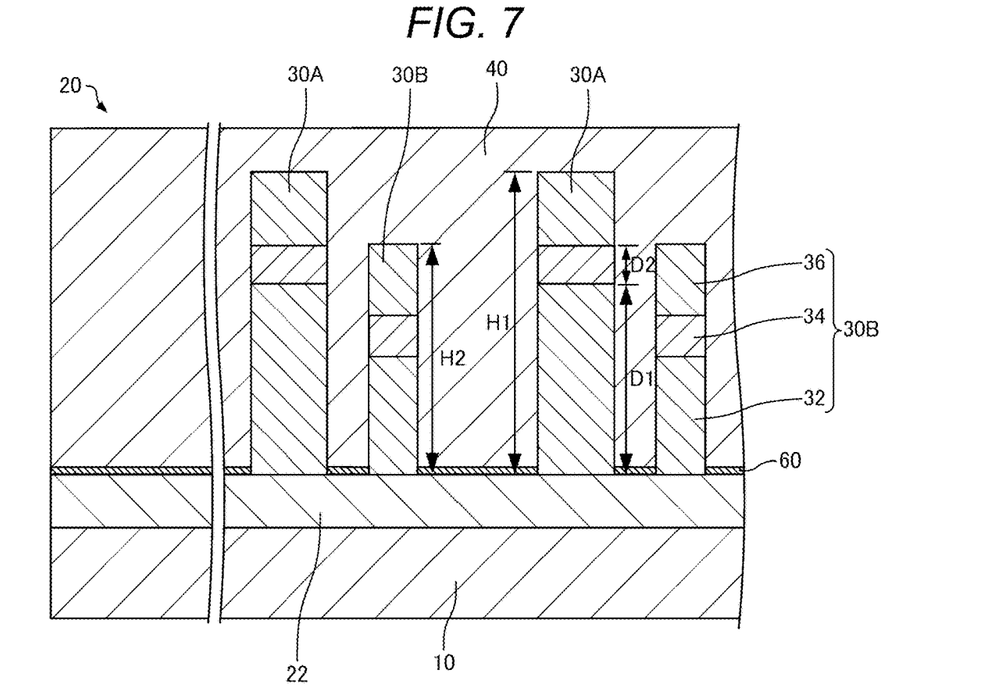
FIG. 7 is a sectional view schematically illustrating a manufacturing process of the light emitting device according to the first embodiment.
Figure 8:
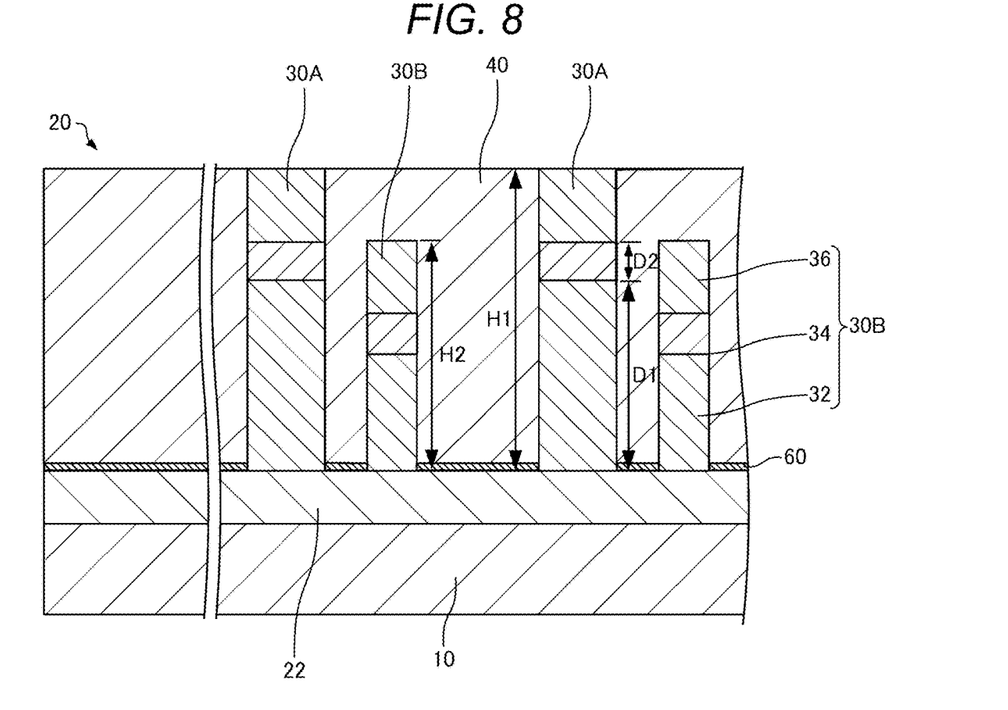
FIG. 8 is a sectional view schematically illustrating a manufacturing process of the light emitting device according to the first embodiment.

Next, a manufacturing method of the light emitting device 100 according to the first embodiment will be described with reference to the drawings. FIGS. 6 to 8 are sectional views schematically illustrating a manufacturing process of the light emitting device 100 according to the first embodiment.

As illustrated in FIG. 6, the buffer layer 22 is epitaxially grown on the substrate 10. Examples of the epitaxial growth method include a metal organic chemical vapor deposition (MOCVD) method, a molecular beam epitaxy (MBE) method, and the like.

Next, the mask layer 60 is formed on the buffer layer 22. The mask layer 60 is formed by, for example, film formation by an electron beam vapor deposition method or a plasma chemical vapor deposition (CVD) method, and patterning by a photolithography technique and an etching technique. An area of the opening for forming the second columnar portion 30B of the mask layer 60 is smaller than an area of the opening for forming the first columnar portion 30A of the mask layer 60. Accordingly, the diameter of the second columnar portion 30B can be made smaller than the diameter of the first columnar portion 30A.

Next, the first semiconductor layer 32, the MQW layer 34, and the second semiconductor layer 36 are epitaxially grown on the buffer layer 22 using the mask layer 60 as a mask. Examples of the epitaxial growth method include an MOCVD method and an MBE method.

The height H2 of the second columnar portion 30B can be set to be lower than the height H1 of the first columnar portion 30A by growing the crystal such that the diameter of the second columnar portion 30B is smaller than the diameter of the first columnar portion 30A. Further, by growing the crystal such that the diameter of the second columnar portion 30B is smaller than the diameter of the first columnar portion 30A, the composition of indium in the MQW layer 34 of the second columnar portion 30B can be reduced to be lower than the composition of the indium of the MQW layer 34 of the first columnar portion 30A.

Through the above steps, the columnar portion group 2 having the plurality of first columnar portions 30A and the plurality of second columnar portions 30B is formed.

As illustrated in FIG. 7, the light propagation layer 40 is embedded in a region where the plurality of first columnar portions 30A and the plurality of second columnar portions 30B are formed. The light propagation layer 40 is formed by, for example, the spin coating method, or the like.

Next, as illustrated in FIG. 8, the light propagation layer 40 is etched such that the first columnar portion 30A is exposed and the second columnar portion 30B is not exposed. The light propagation layer 40 is etched by, for example, wet etching or dry etching. The light propagation layer 40 may be etched by combining wet etching and dry etching. Next, the light propagation layer 40 is patterned into a predetermined shape to expose a region where the first electrode 50 is formed.

As illustrated in FIG. 1, the first electrode 50 is formed on the buffer layer 22, and the second electrode 52 is formed on the second semiconductor layer 36 and on the light propagation layer 40. The first electrode 50 and the second electrode 52 are formed by, for example, a vacuum evaporation method. An order of forming the first electrode 50 and the second electrode 52 is not particularly limited.

Through the above steps, the light emitting device 100 can be manufactured.

Figure 9:
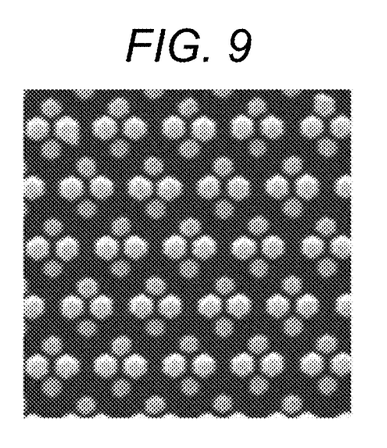
FIG. 9 is an SEM image of a first semiconductor layer of a first columnar portion and a first semiconductor layer of a second columnar portion.
Figure 10:
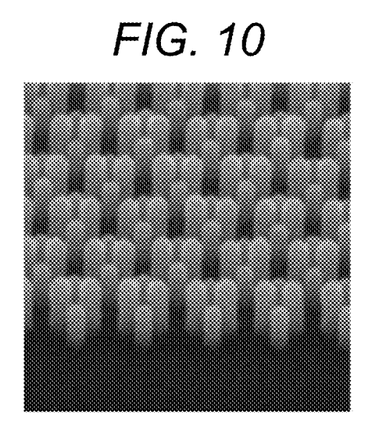
FIG. 10 is an SEM image of the first semiconductor layer of the first columnar portion and the first semiconductor layer of the second columnar portion.

FIGS. 9 and 10 are scanning electron micrographs of the first semiconductor layer 32 of the first columnar portion 30A and the first semiconductor layer 32 of the second columnar portion 30B. As described above, the scanning electron micrographs illustrated in FIGS. 9 and 10 are images obtained by capturing a state where the area of the opening for forming the second columnar portion 30B of the mask layer 60 is formed to be smaller than the area of the opening for forming the first columnar portion 30A, and the first semiconductor layer 32 is epitaxially grown. In FIGS. 9 and 10, a diameter of the first semiconductor layer 32 of the first columnar portion 30A is 84 nm, and a height of the first semiconductor layer 32 of the first columnar portion 30A is 296 nm. On the other hand, the diameter of the first semiconductor layer 32 of the second columnar portion 30B is 68 nm, and the height of the first semiconductor layer 32 of the second columnar portion 30B is 222 nm. In this manner, the columnar portions having different heights can be grown at the same time by making the diameters of the columnar portions different.

1.3. Modification Example

Next, a modification example of the light emitting device 100 according to the first embodiment will be described. In each modification example described below, members having the same functions as those of the above-described light emitting device 100 will be given the same reference numerals, and the detailed description thereof will be omitted.

1.3.1. First Modification Example

Figure 11:
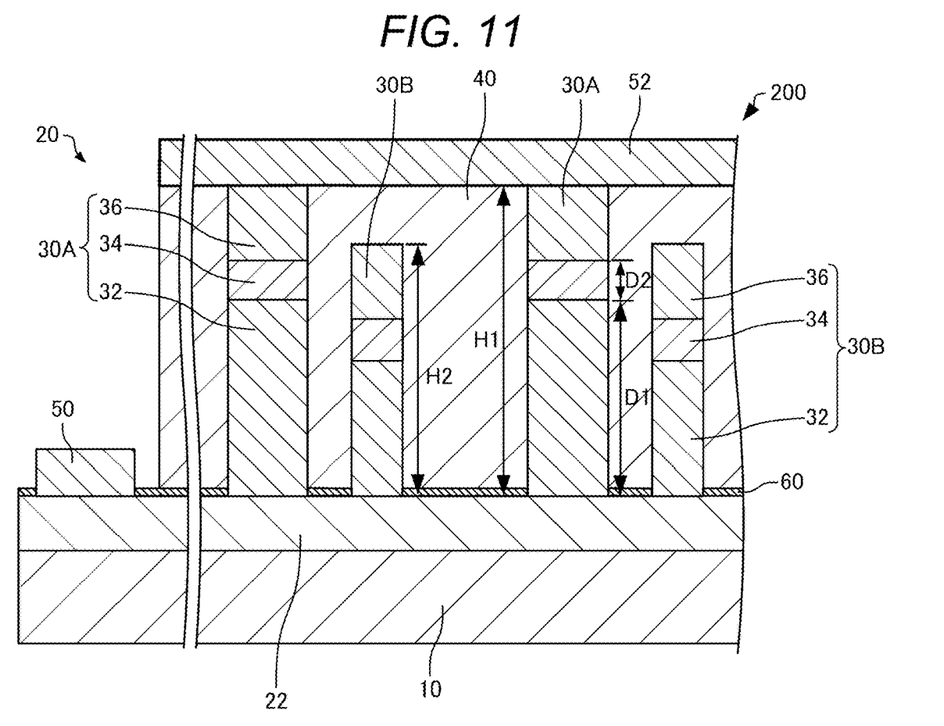
FIG. 11 is a sectional view schematically illustrating a light emitting device according to a first modification example.

FIG. 11 is a sectional view schematically illustrating a light emitting device 200 according to a first modification example.

In the above-described light emitting device 100, as illustrated in FIG. 1, the height H2 of the second columnar portion 30B is equal to the sum of the thickness D1 of the first semiconductor layer 32 of the first columnar portion 30A and the thickness D2 of the MQW layer 34 of the first columnar portion 30A. In other words, H2=D1+D2 is satisfied.

On the other hand, in the light emitting device 200, as illustrated in FIG. 11, the height H2 of the second columnar portion 30B is larger than the sum of the thickness D1 of the first semiconductor layer 32 of the first columnar portion 30A and the thickness D2 of the MQW layer 34 of the first columnar portion 30A. In other words, D1+D2 H2<H1 is satisfied.

In the light emitting device 200, similar to the above-described light emitting device 100, the filling factor of the columnar portion on the upper side of the MQW layer 34 of the first columnar portion 30A becomes lower. Therefore, the amount of light that leaks from the MQW layer 34 of the first columnar portion 30A to the upper side of the MQW layer 34 can be reduced, and the amount of light absorbed by the second electrode 52 can be reduced. Therefore, in the light emitting device 200, the optical confinement factor in the first columnar portion 30A can be increased, and the lasing threshold value can be reduced.

1.3.2. Second Modification Example

For example, in the above-described light emitting device 100, the InGaN-based MQW layer 34 has been described, but various material systems that can emit light when a current is injected in accordance with the wavelength of the emitted light can be used as the MQW layer 34. For example, semiconductor materials, such as AlGaN, AlGaAs, InGaAs, InGaAsP, InP, GaP, and AlGaP, can be used.

2. Second Embodiment

Figure 12:
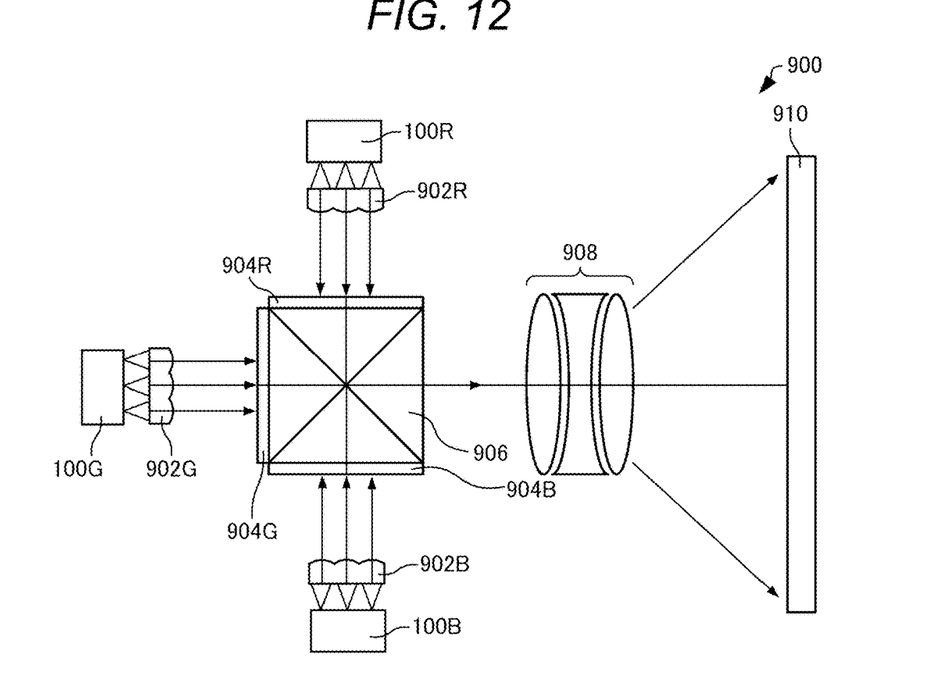
FIG. 12 is a view schematically illustrating a projector according to a second embodiment.

Next, a projector according to a second embodiment will be described with reference to the drawings. FIG. 12 is a view schematically illustrating a projector 900 according to the second embodiment.

The projector 900 includes the light emitting device 100 as a light source, for example.

The projector 900 includes a housing (not illustrated) and a red light source 100R, a green light source 100G, and a blue light source 100B that are provided in the housing and respectively emit red light, green light, and blue light. For convenience, in FIG. 12, the red light source 100R, the green light source 100G, and the blue light source 100B are simplified.

The projector 900 further includes a first lens array 902R, a second lens array 902G, a third lens array 902B, a first light modulation device 904R, a second light modulation device 904G, a third light modulation device 904B, and a projection device 908 that are provided in the housing. The first light modulation device 904R, the second light modulation device 904G, and the third light modulation device 904B are, for example, transmissive liquid crystal light valves. The projection device 908 is, for example, a projection lens.

The light emitted from the red light source 100R is incident on the first lens array 902R. The light emitted from the red light source 100R can be condensed by the first lens array 902R, for example, superimposed.

The light condensed by the first lens array 902R is incident on the first light modulation device 904R. The first light modulation device 904R modulates the incident light in accordance with image information. Then, the projection device 908 enlarges and projects the image formed by the first light modulation device 904R onto a screen 910.

The light emitted from the green light source 100G is incident on the second lens array 902G. The light emitted from the green light source 100G can be condensed by the second lens array 902G, for example, superimposed.

The light condensed by the second lens array 902G is incident on the second light modulation device 904G. The second light modulation device 904G modulates the incident light in accordance with image information. Then, the projection device 908 enlarges and projects the image formed by the second light modulation device 904G onto the screen 910.

The light emitted from the blue light source 100B is incident on the third lens array 902B. The light emitted from the blue light source 100B can be condensed by the third lens array 902B, for example, superimposed.

The light condensed by the third lens array 902B is incident on the third light modulation device 904B. The third light modulation device 904B modulates the incident light in accordance with image information. Then, the projection device 908 enlarges and projects the image formed by the third light modulation device 904B onto the screen 910.

Further, the projector 900 can include a cross dichroic prism 906 that combines the light emitted from the first light modulation device 904R, the second light modulation device 904G, and the third light modulation device 904B and guides the light to the projection device 908.

The three rays of color light modulated by the first light modulation device 904R, the second light modulation device 904G, and the third light modulation device 904B are incident on the cross dichroic prism 906. The cross dichroic prism 906 is formed by bonding four right angle prisms, and a dielectric multilayer film that reflects red light and a dielectric multilayer film that reflects blue light are arranged in a cross shape on the inner surface thereof. The dielectric multilayer films combine the three rays of color light to form light that represents a color image. The combined light is projected onto the screen 910 by the projection device 908, and an enlarged image is displayed.

In addition, the red light source 100R, the green light source 100G, and the blue light source 100B control the light emitting device 100 as video pixels in accordance with image information, and accordingly, a video may be directly formed without using the first light modulation device 904R, the second light modulation device 904G, and the third light modulation device 904B. Then, the projection device 908 may enlarge and project the video formed by the red light source 100R, the green light source 100G, and the blue light source 100B onto the screen 910.

In the above-described example, a transmissive liquid crystal light valve is used as the light modulation device, but a light valve other than liquid crystal may be used, or a reflective light valve may be used. Examples of such a light valve include a reflective liquid crystal light valve and a digital micro mirror device. Further, the configuration of the projection device is appropriately changed depending on the type of light valve used.

Further, the light source can also be applied to the light source device of the scanning type image display device including scanning means which is an image forming device for displaying an image of a desired size on a display surface by scanning the light from the light source on the screen.

The light emitting device according to the above-described embodiment can be used in addition to the projector. Applications other than the projector include light sources, such as indoor/outdoor lighting, display backlights, laser printers, scanners, in-vehicle lights, sensing devices using light, and communication devices.

In the present disclosure, a part of the configuration may be omitted within a range having the characteristics and effects described in the application, or each embodiment or modification examples may be combined.

The present disclosure is not limited to the above-described embodiments, and various modifications can be made. For example, the present disclosure includes substantially the same configuration as that described in the embodiments. The substantially same configuration is, for example, a configuration having the same function, method, and result, or a configuration having the same purpose and effect.

In addition, the present disclosure includes a configuration in which a non-essential part of the configuration described in the embodiments is replaced. In addition, the present disclosure includes a configuration that exhibits the same operational effects as those of the configuration described in the embodiment or a configuration that can achieve the same purpose. In addition, the present disclosure includes a configuration in which a known technique is added to the configuration described in the embodiments.

What is claimed is:

1. A light emitting device comprising:
a substrate;
a laminated structure provided on the substrate and having a plurality of first columnar portions and a plurality of second columnar portions, the laminated structure extending from the substrate along a first direction; and
a first electrode and a second electrode, wherein
each of the plurality of first columnar portions and each of the plurality of second columnar portions are alternately disposed in a second direction orthogonal to the first direction,
each of the plurality of first columnar portions is configured with:
a first semiconductor layer having a first conductivity type;
a second semiconductor layer having a second conductivity type different from the first conductivity type; and
a light emitting layer provided between the first semiconductor layer and the second semiconductor layer,
light generated in the light emitting layer propagates through the plurality of first columnar portions and the plurality of second columnar portions,
a height along the first direction of each of the plurality of second columnar portions is equal to or larger than a sum of a thickness along the first direction of the first semiconductor layer and a thickness along the first direction of the light emitting layer, and is lower than a height along the first direction of each of the plurality of first columnar portions,
the first semiconductor layer is provided between the substrate and the light emitting layer,
the first electrode is electrically coupled to the first semiconductor layer,
the second electrode is electrically coupled to the second semiconductor layer, and
the plurality of second columnar portions is not electrically coupled to the second electrode, and a current is not injected to the plurality of second columnar portions.

2. The light emitting device according to claim 1, wherein a diameter of each of the plurality of second columnar portions is smaller than a diameter of each of the plurality of first columnar portions.

3. The light emitting device according to claim 1, further comprising:
a light propagation layer which is provided between the plurality of first columnar portions and the plurality of second columnar portions, and has a refractive index smaller than that of the first semiconductor layer and the second semiconductor layer.

4. The light emitting device according to claim 3, wherein the light propagation layer is provided between the plurality of second columnar portions and the second electrode.

5. A projector comprising:
the light emitting device according to claim 1; and a lens array through which the light generated in the light emitting device passes.

6. The light emitting device according to claim 1, wherein each of the plurality of second columnar portions is configured with:
   a third semiconductor layer having the first conductivity type;
   a fourth semiconductor layer having the second conductivity type; and
   a MQW layer provided between the third semiconductor layer and the fourth semiconductor layer, and
no current is injected into the MQW layer of each of the plurality of second columnar portions and light emission does not occur in the MQW layer of each of the plurality of second columnar portions.

7. A light emitting device comprising:
a substrate;
a laminated structure provided on the substrate and having a plurality of first columnar portions and a plurality of second columnar portions, the laminated structure extending from the substrate along a first direction;
a light propagation layer surrounding the plurality of first columnar portions and the plurality of second columnar portions; and
a first electrode and a second electrode, wherein
the plurality of first columnar portions and the plurality of second columnar portions are disposed in a second direction orthogonal to the first direction,
each of the plurality of first columnar portions is configured with:
   a first semiconductor layer having a first conductivity type;
   a second semiconductor layer having a second conductivity type different from the first conductivity type; and
   a light emitting layer provided between the first semiconductor layer and the second semiconductor layer,
light generated in the light emitting layer propagates through the plurality of first columnar portions, the plurality of second columnar portions, and the light propagation layer,
each of the plurality of second columnar portions is configured with:
   a third semiconductor layer having the first conductivity type; and
   a fourth semiconductor layer having the second conductivity type, and the third semiconductor layer is located closer to the first electrode than the fourth semiconductor layer,
a height along the first direction of each of the plurality of second columnar portions is equal to or larger than a sum of a thickness along the first direction of the first semiconductor layer and a thickness along the first direction of the light emitting layer, and is lower than a height along the first direction of each of the plurality of first columnar portions,
the first semiconductor layer is provided between the substrate and the light emitting layer,
the first electrode is electrically coupled to each of the first semiconductor layer and the third semiconductor layer,
the second electrode is electrically coupled to the second semiconductor layer, and
the fourth semiconductor layer of each of the plurality of second columnar portions is not electrically coupled to the second electrode, and the light propagation layer completely surrounds top and side surfaces of the fourth semiconductor layer of each of the plurality of second columnar portions.

* * * * *